(12) United States Patent
Hennessy et al.

(10) Patent No.: US 7,391,133 B1
(45) Date of Patent: Jun. 24, 2008

(54) HYBRID SWITCH

(76) Inventors: Michael J. Hennessy, 9 Patroon Pl., Ballston Lake, NY (US) 12019; Eduard K. Mueller, 96 Sweet Rd., Ballston Lake, NY (US) 12019

( * ) Notice: Subject to any disclaimer, the term of this patent is extended or adjusted under 35 U.S.C. 154(b) by 583 days.

(21) Appl. No.: 10/670,810

(22) Filed: Sep. 25, 2003

Related U.S. Application Data (60) Provisional application No. 60/436,777, filed on Dec. 27, 2002, provisional application No. 60/414,121, filed on Sep. 28, 2002.

(51) Int. Cl.
*H01H 33/59* (2006.01)
(52) U.S. Cl. .................. 307/113; 307/115; 307/125; 307/131; 307/141.4; 307/143; 361/2; 361/8; 361/13
(58) Field of Classification Search .......... 307/113; 361/2, 8, 13
See application file for complete search history.

(56) References Cited

U.S. PATENT DOCUMENTS

| 5,155,289 | A | * | 10/1992 | Bowles | 89/8 |
| 5,774,000 | A | * | 6/1998 | Vercellotti et al. | 327/110 |
| 5,793,586 | A | * | 8/1998 | Rockot et al. | 361/8 |
| 5,828,112 | A | * | 10/1998 | Yamaguchi | 257/378 |
| 5,953,224 | A | * | 9/1999 | Gold et al. | 363/98 |
| 6,903,373 | B1 | * | 6/2005 | Lotfi et al. | 257/77 |

* cited by examiner

*Primary Examiner*—Michael Sherry
*Assistant Examiner*—Hal I. Kaplan
(74) *Attorney, Agent, or Firm*—Leonard Cooper (57) ABSTRACT

An electrical switching topology for a hybrid switch provides extremely low losses in both cryogenic and non-cryogenic electronic systems. In this switch having switch modules connected in parallel, switching losses in a first module are separated from conduction losses in the parallel-connected second module. The conduction losses are then further reduced by cryogenically cooling the second module. Since the switching losses of the first module can be absorbed outside a cryogenic container, the switching losses do not add to the cryogenic heat load. In other applications, the switching module operates at lower temperatures to provide higher switching speeds and reduces switching heat generation.

19 Claims, 8 Drawing Sheets

HYBRID SWITCH

This patent claims the benefit of provisional patent applications 60/414,121 filed on Sep. 28, 2002 and 60/436,777 filed on Dec. 27, 2002.

BACKGROUND OF THE INVENTION

Mechanical or electrical switching involves power losses. There are two types of losses in switching, switching losses and conduction losses. If the switch is extremely fast and conducts well in the on state, the switching losses are mainly associated with the switching time and attached circuits The conduction loss is determined by a switching module's on-state resistance after switching occurs and current is flowing through the switch terminals.

Figure 1:
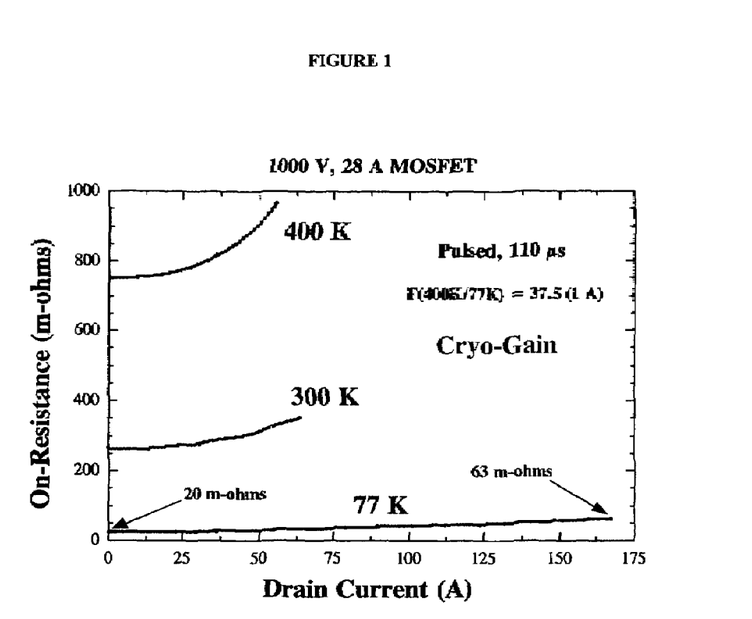
FIG. 1 is a graph showing the on-resistance in milli-ohms of a MOSFET as a function of temperature.

MOSFETs operate exceptionally well at low temperatures especially at cryogenic temperatures (below 200 K). FIG. 1 shows a dramatic drop, a reduction factor of 37.5, in on-state resistance from temperatures 400 K to 77 K. This leads to very low conduction losses at cryogenic temperatures, a very attractive feature for a switch. Switching losses, on the other hand, are not affected by temperature directly but by the switching speed of the electronic drive system. For example, FIG. 8, in the case of switching inductive loads, the current ($I_o$) is constant during switching and the voltage across the switch falls linearly from $V_o$ to nearly zero over some switching time $\tau$. The switching energy dissipated in this transition is $\frac{1}{2} V_o I_o \tau$. The dissipated power is the dissipated energy times the number of switching transitions per second. For two transitions per cycle, the dissipated power is $V_o I_o \tau / T$, where T is the period of the switching cycle. In this instance, the switching losses depend only on the switch voltage, current and duty cycle ($\tau/T$).

Switching losses can contribute a great deal of heating. Lowering the MOSFET module temperature increases the switching speed and reduces the intrinsic switching time, thus theoretically reducing the switching losses of the MOSFET switch. In practice, however, it is difficult to take advantage of these higher speeds. At low temperatures, there is a refrigeration penalty due to the switching loss heat load, which adds to the overall system losses. The reduction in switching losses due to a speed increase at lower temperatures usually does not offset the refrigeration penalty. With the increased speeds come other practical problems including ringing, etc. Many times, it is best to run the modules at moderate speeds, slower than that of the intrinsic module itself.

SUMMARY OF THE INVENTION

The hybrid switch includes a first solid state module or group of series- and/or parallel-connected modules C placed in parallel with a second solid state module or group of series-and/or parallel-connected modules S. The parallel modules are connected as a hybrid switch to be placed in series and/or parallel in, for example, power converter topologies driving a load. One or both of these modules or groups of modules is housed inside a cryogenic container for cooling. Temperature inside this cryogenic container is controlled via a flow of a liquid cryogen, such as liquid nitrogen, liquid helium, or any other cold liquid or is controlled by one or more external refrigerators, or by a flow of one or more cold, gaseous refrigerants.

When only one of these modules or groups of modules is cooled, the other module or group of modules can be placed outside the cryogenic container, and the parallel connection between the first and second modules or groups of modules is achieved via electrical feed-throughs, that is, wires that pass through the walls of the cryogenic container.

A control circuit is connected to the gates of both the first and the second module or group of modules to selectively place the modules in a conducting state or non-conducting open state. This control circuit may or may not be cooled, and therefore may or may not be housed inside the cryogenic container.

When, for example, steady-state current is flowing through the hybrid switch to the load, the currents flows through the switch module(s) C that has the lower resistance and therefore the lower conduction loss of the parallel pair of modules. This conducting switch module C is generally cryo-cooled for low $I^2R$ losses. The other parallel module(s) S is controlled to be in the open, non-conducting state or is in the on state but flows essentially zero current because it is in parallel with the much lower resistance of the conducting switch module C.

When current to the load is to be terminated by opening the hybrid switch, the conducting module C receives a control signal that changes that module C to the non-conducting state. Prior to that signal, the parallel switching module S, which was not conducting, receives a control signal to conduct, or maintains an on state if it S were non-conducting only because of the above-mentioned parallel condition relative to the conducting branch C of the two switch modules. Then, when the initially conducting module C receives the signal for non-conduction, current to the load diverts to the parallel module S of the switch. With the load current flowing through the switching module S, the switching module S is given a signal to open. Current to the load ceases and switching losses are generated in the module S, which last carried load current. Thus, one parallel module C generates conduction losses while load current flows and the other parallel module S generates switching losses as load current drops to zero. Each module may be optimized to reduce the loss that it generates.

Superconducting wires, connectors, cables, thin films, etc., are used wherever possible. For example, the parallel connections within the first and/or second module or group of modules can be made using superconducting thin films, provided that either the first and/or second module or group of modules is cooled. Heat sinks can be added to either the first or second module or group of modules, and wherever else they are necessary to absorb and distribute the heat loads generated in the module(s).

DESCRIPTION OF PREFERRED EMBODIMENTS

A way to reduce switching losses at low temperatures is to parallel two switches, one switch maintained at a low temperature to absorb the conduction losses, while maintaining the other switch at a higher temperature for absorbing the switching losses. This parallel combination leads to high efficiency and is the basis of this invention. The higher temperature switch can be a MOSFET or other solid state switch (ie, IGBT, IGCT, etc.). The conduction losses are absorbed by the more efficient cooled MOSFET switch, which has a lower on-state resistance. It should be understood that the higher temperature may equal, exceed, or be less than room temperature, although advantage of operating one of the two parallel switches at room temperature is apparent in that equipment and operational requirements are simplified.

Embodiments are described and illustrated herein with the "higher temperature" at room temperature (300 K) although, as stated above, the higher temperature can equal, be less than, or exceed room temperature. The embodiments are described and illustrated generally as operating with the "low temperature" at a cryogenic level (77 K). However, the only limitation on the "low temperature" is that it is lower than the "higher temperature".

The HYMOS Concept

Figure 2:
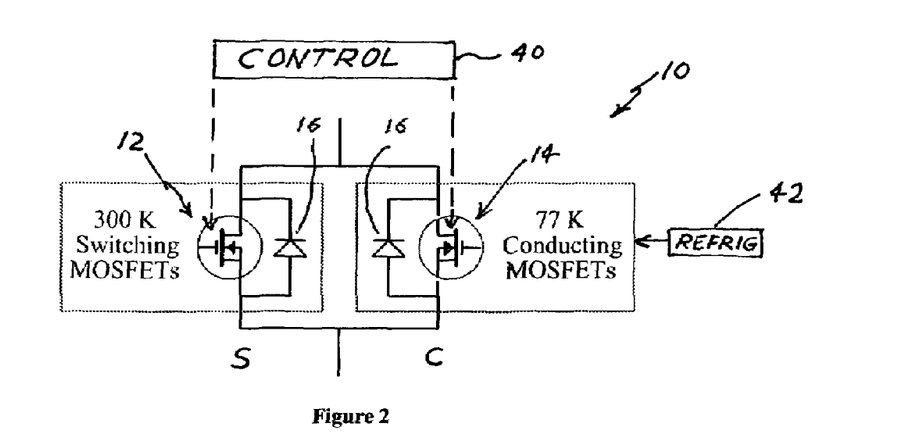
FIG. 2 is a schematic diagram of an embodiment of the invention, a hybrid switching module.

The hybrid switch 10 of FIG. 2 includes two MOSFETs, 12, 14, in parallel, one 12 for switching and one 14 for conduction. A control unit 40 sets the MOSFETs respectively in a conducting or non-conducting state. This parallel combination 10 of a switching module and a separate conduction module is referred to herein as a HYMOS topology, short for "Hybrid MOSFET." There are several different variations on and embodiments of the HYMOS topology, and these embodiments need not always involve MOSFETs as the active modules. In this particular case of FIG. 2, the switching MOSFET 12 is operated at high temperatures (300 K or above) whereas the conduction MOSFET 14 is operated at a low temperature (77 K nominal) provided by a refrigeration unit 42. The MOSFETs in all of these diagrams are shown with diodes 16 that are integral to their structure.

Figure 3:
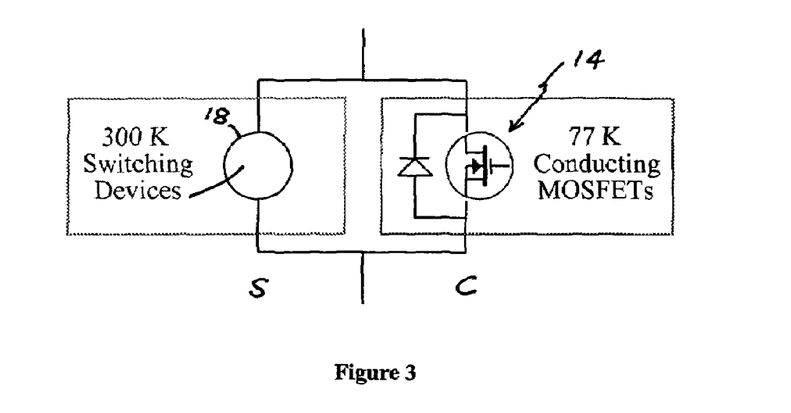
FIG. 3 is an alternative embodiment of a hybrid switching module in accordance with the invention.
Figure 4:
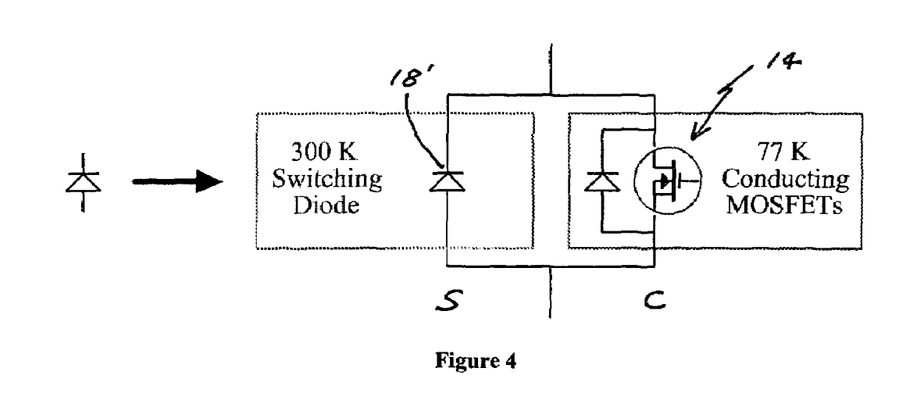
FIG. 4 illustrates an exemplary construction of the embodiment of FIG. 3.

In FIG. 3, a cooled MOSFET 14 (77 K) is generically connected in parallel with other types of room temperature switching modules 18, that is, other than MOSFETS. These can be, for example, IGBTs, IGCTs, transistors, etc. Diodes may also be used as switches 18. FIG. 4 illustrates an equivalent hybrid MOS circuit. In this case the hybrid MOSFET equivalent circuit is a diode 18' in parallel with a cold MOSFET 14. Here the switching losses are absorbed by the diode 18' at 300 K and the cooled MOSFET 14 is turned on later to reduce or eliminate the diode conduction losses. The circuit described in FIG. 2 can also operate as a diode. In this case the switch is actively opened when reverse biased.

Figure 5:
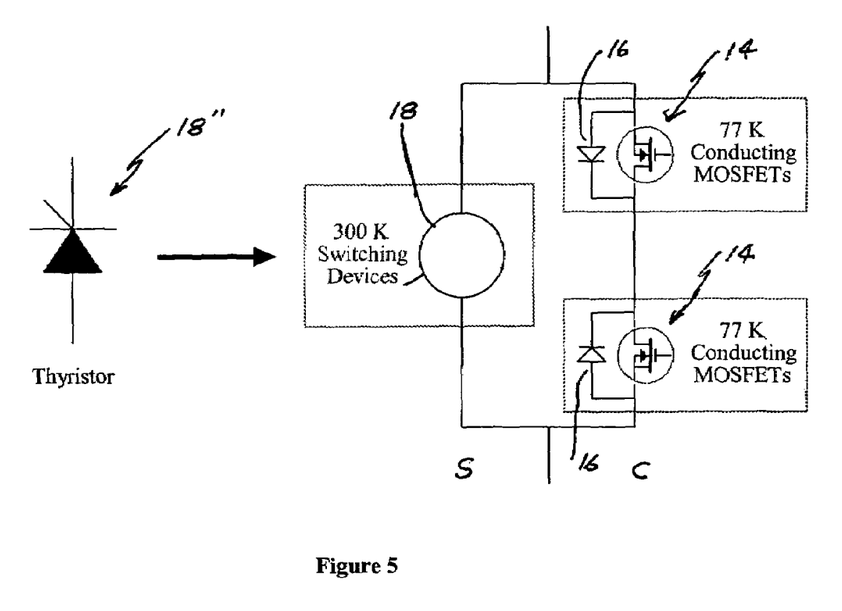
FIG. 5 is another construction of the embodiment of FIG. 3, suited for bi-directional operation.

For thyristor type (or other bipolar) modules 18", two cooled MOSFETs 14 with intrinsic diodes 16 connected antiparallel are shown in FIG. 5. The MOSFET pair can stand off bipolar voltages without conducting.

For high voltage operation (beyond the voltage breakdown of a single module), many cooled MOSFETs 14 may be connected in series to increase the voltage breakdown level. For added current, the cooled MOSFETs 14 may be paralleled.

Figure 6:
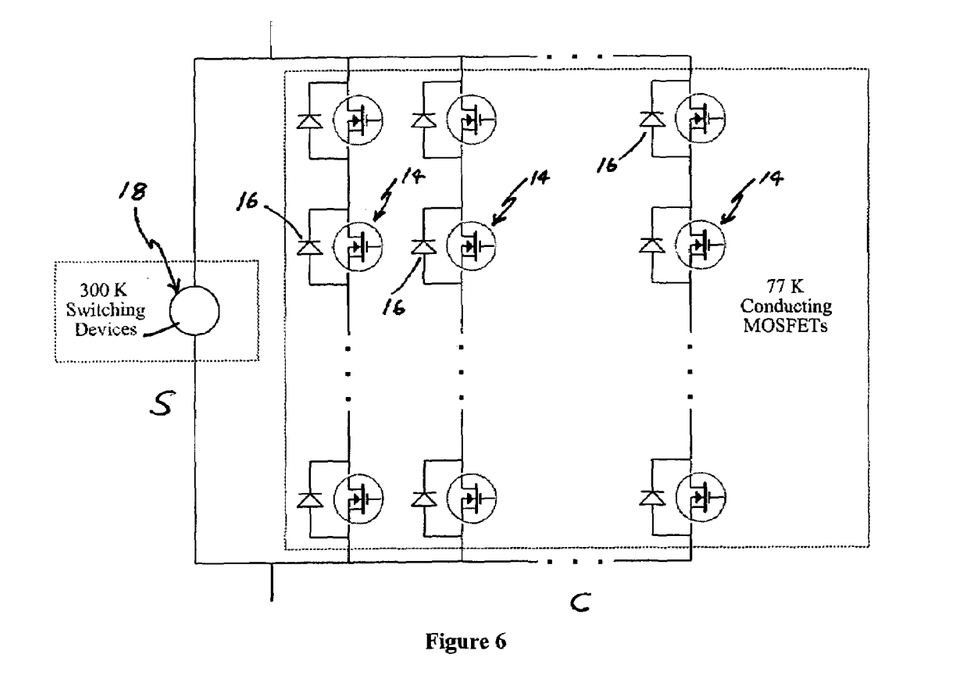
FIG. 6 is another alternative embodiment of the switching module of FIG. 3, for higher current and higher voltage operation.

In FIG. 6, a series parallel arrangement is shown which gives added voltage and current capability beyond the specifications of a single module. Divider networks (not shown) may be necessary to insure the even distribution of voltage across the MOSFETs 14. A high voltage switching module 18 such as, for example, another string of MOSFETs, an IGBT, IGCT, or diode is put in parallel at room temperature to absorb the switching losses. The main advantage of this configuration is the low conduction loss. A secondary advantage is the fact that the cooled series MOSFET switch is protected during switching. Sometimes transients can cause series MOSFET circuits to become unbalanced, leading to an over-voltage situation across a single module.

Figure 7:
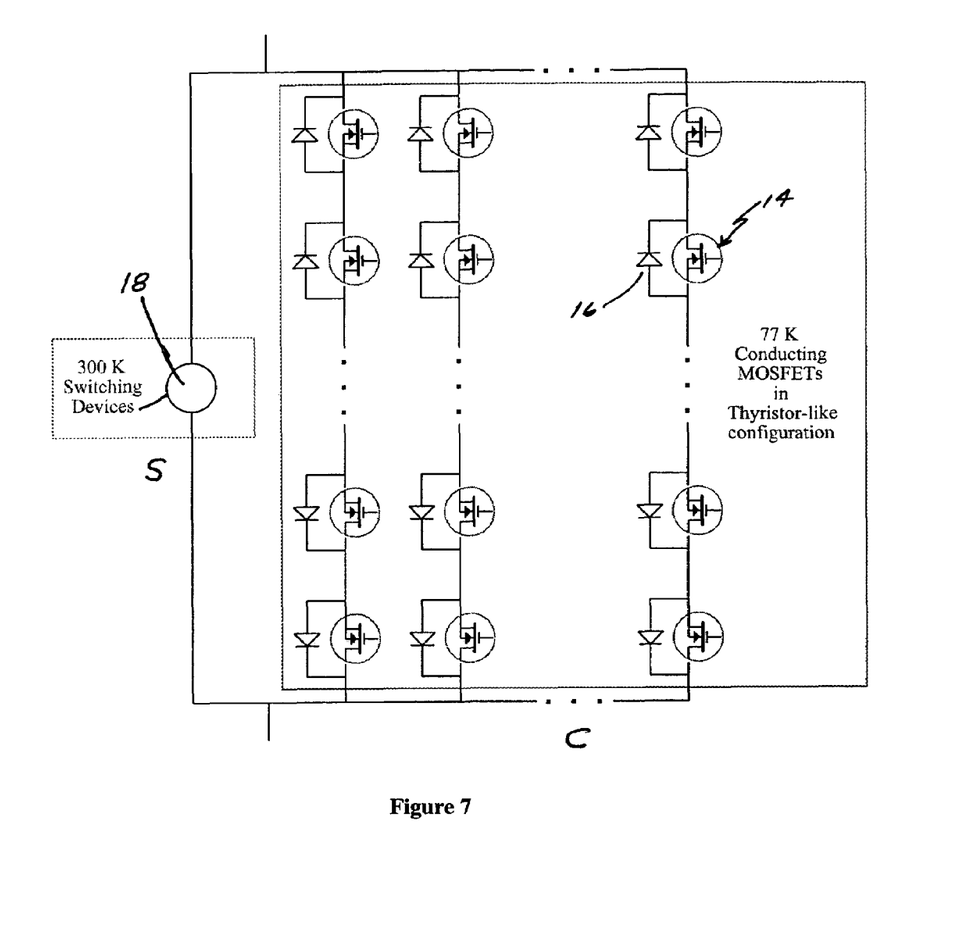
FIG. 7 is a higher voltage and higher current embodiment of the structure in FIG. 5.

A high voltage, high current bipolar switch is illustrated in FIG. 7. The bipolar switch in FIG. 7 uses a group of low temperature (77 K) series-parallel MOSFETs 14 with opposing diodes 16. This topology is based on FIG. 5, but has added voltage and current capability.

Figure 8:
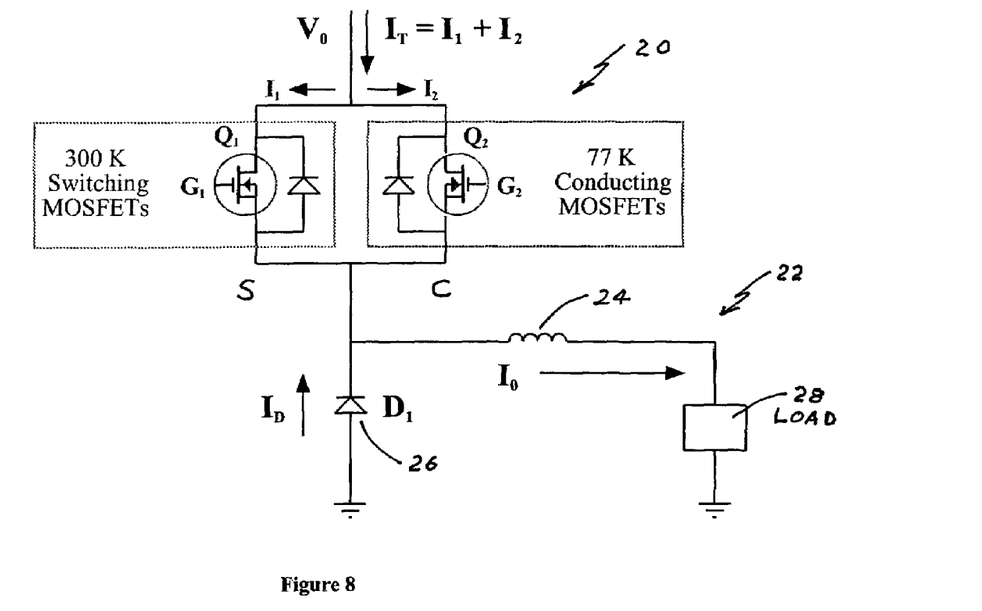
FIG. 8 is a circuit of a hybrid switching module of the invention used to switch current in an inductor.
Figure 9:
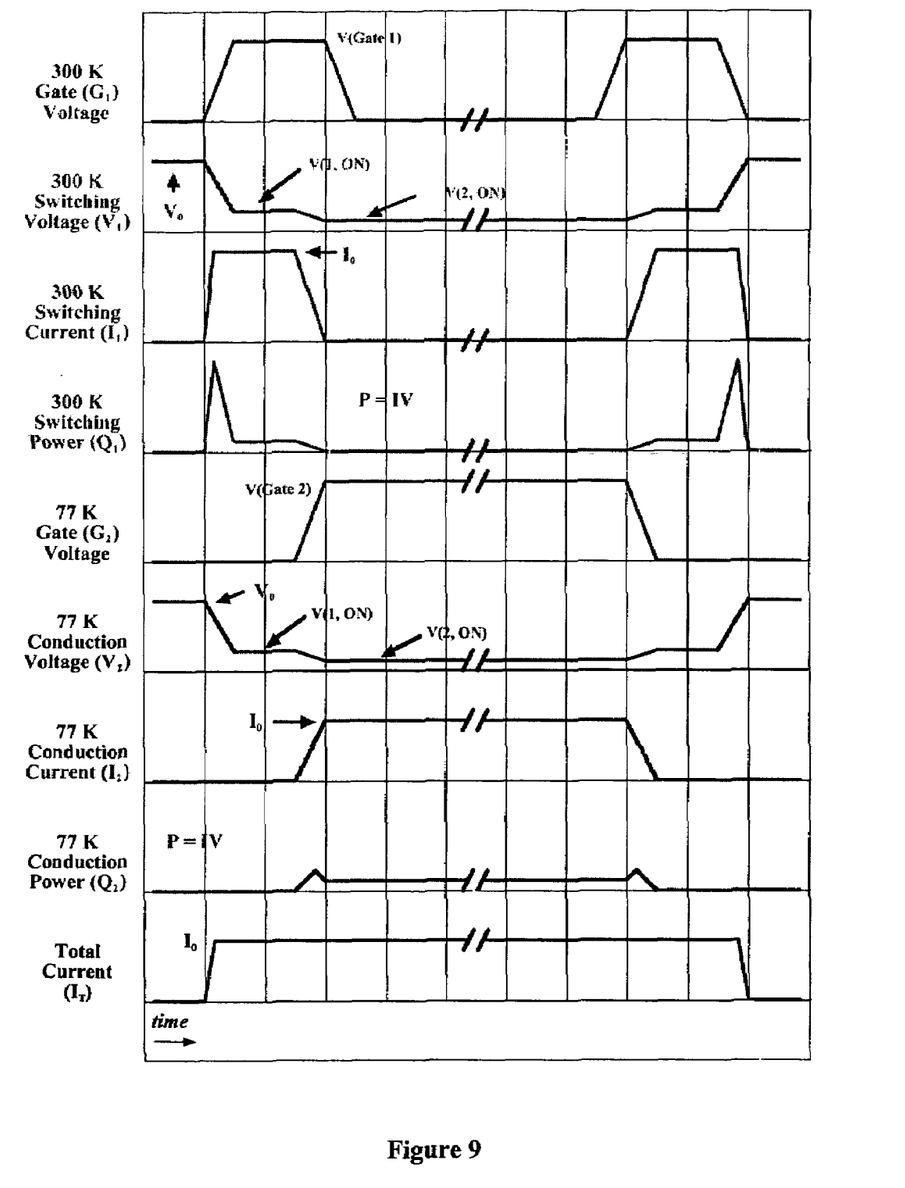
FIG. 9 provides timing diagrams associated with the circuit in FIG. 8.

FIG. 8 provides a practical example of the hybrid MOSFET switching module 20 in accordance with the invention in a circuit 22 including an inductor 24, diode 26 and load 28. A timing diagram is shown in FIG. 9. The switch 20 operates as follows:

1) Assume the inductor 24 is carrying a current $I_o$ which is flowing through a perfect diode, so that, $I_o=I_D$. The switches $Q_1$ and $Q_2$ are initially opened. The initial voltage across the switch is $V_o$.

2) The switch is activated in the ON or closed state by applying voltage to $G_1$ which causes the current to transfer from the diode into the 300 K switch $Q_1$. When the current is completely transferred to $Q_1$ we have $I_1=I_0$. Once the voltage across the switch is stabilized to the on-state of V (1, on), $G_2$ is turned on. Because $Q_2$ has a lower on-state voltage than $Q_1$, the current transfers from $Q_1$ to $Q_2$, at which time $I_2=I_0$. Since the V (2,on) is much less than V(1,on), the conduction losses are dramatically lowered.

3) The switch is opened in the following way. $G_1$ is turned on again to prepare $Q_1$ to conduct. $G_2$ is turned off after $Q_1$ is on. The current smoothly transfers from $Q_2$ to $Q_1$. After the current is completely transferred to $Q_1$, $Q_1$ is opened by turning off $G_1$. The room temperature switch $Q_1$ takes all the turn-off losses and $Q_2$ remains off in this process. In this manner, the switching losses are isolated from the conduction switch $Q_2$.

SCONS Topologies

The concept of having a hybrid switch, containing separate switch modules dedicated to switching while other switch modules are dedicated to conduction during the on time, is a circuit topology herein named Switch-Conduction Switch (SCONS). There are two subgroups of the SCONS topology: HYPER-CON and HYPER-SWITCH. The term "HYPER-CON" is an abbreviation for "Hyper-Conducting Module", and the HYMOS topology falls under this category. This is merely a matter of terminology, and both the HYPER-CON and HYMOS topologies have been described earlier in this application. A HYMOS circuit is simply a HYPER-CON circuit utilizing MOSFETs as the conduction components 14.

Figure 10:
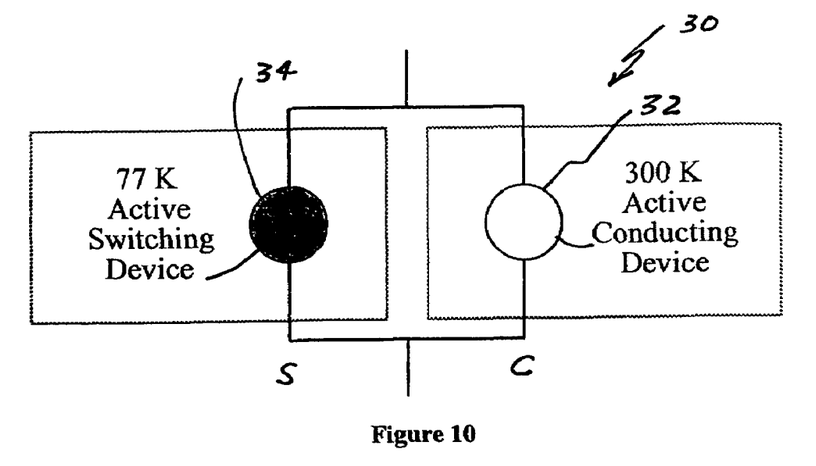
FIG. 10 illustrates a HYPER-SWITCH of the invention including a cryogenically cooled switching module and a room-temperature-operated conduction module.
Figure 11:
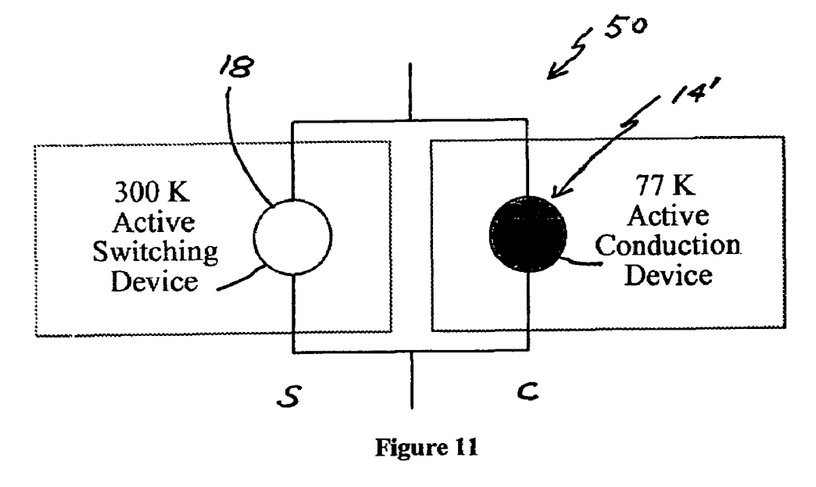
FIG. 11 illustrates the HYPER-CON concept of the invention, utilizing a cryogenically cooled conduction module.

The following portion of the application describes a second type of module 30, 50 called a HYPER-SWITCH, which is basically a reverse HYPER-CON. These modules are illustrated respectively in FIGS. 10 and 11. Both modules use two groups of switch modules in tandem. One switch module provides the turn-on and turn-off losses while the other module provides the conduction losses during the "ON" time of the switch. The "ON" time losses are mainly conduction losses.

In the HYPER-CON (FIG. 11), conduction losses are absorbed by modules 14' operating at low temperatures, whereas the switching losses are absorbed at higher temperatures, typically, but not limited to, room temperature by modules 18. The HYPER-CON concept takes advantage of the reduction of on-state voltage drop in many cryo-cooled semiconductor components, especially MOSFETs.

In the HYPER-SWITCH 30 (FIG. 10), the opposite is true. The conduction losses are absorbed typically at room temperature by module 32 and the switching losses are taken at lower temperatures by module 34. The HYPER-SWITCH concept takes advantage of the reduction in switching times exhibited by many semiconductor power components at low temperatures. As in the case of HYPER-CONs, HYPER-SWITCHES can use MOSFETs or non-MOSFETS, such as IGBTs, IGCTs, diodes, or thyristors. For high voltage or high current applications, one or both of the switching and conduction modules can be realized using chains of series- or parallel-connected components.

MOSFETs and IGBTs have very high speeds at low temperatures. MOSFETs are so fast that the speeds may not be practical in large-scale series/parallel arrays. In high-voltage, high current applications, if the series-parallel connections of MOSFETs prove cumbersome, or where the number of MOSFET chips or modules becomes exorbitant due to the need for such connections, it may be more beneficial to take advantage of only the improved switching speeds in IGBTs, IGCTs, diodes, or thyristors at low temperatures. The HYPER-SWITCH conduction components may be chosen from the group of non-MOSFET semiconductors listed above, or they may be MOSFETs depending on the application.

While few components can challenge the cryo-MOSFET in either switching speed or reduced conduction losses, a HYPER-SWITCH containing all or some non-MOSFETs may prove a more cost-effective and less complex alternative because fewer components are required. In particular, the need for complex series-parallel connections could be eliminated.

SCONS Topologies at Other Temperatures

The SCONS topology, having a hybrid switch containing separate switch modules dedicated to switching and others dedicated to conduction, is a general concept applicable to any circuitry at any operating temperature. The switching modules are dedicated to absorbing the turn on and turn off losses. This performance can be enhanced by temperature (HYPER-SWITCH) and/or by careful selection of layouts and parts. For high speed switching this means the package layout is RF-like in nature, with minimum inductance on leads and attention paid to reduce ringing in the circuitry. On the other hand, the conduction portion of the switch is optimized to absorb and reduce conduction losses. These losses can be minimized by lowering the temperature (HYPER-CON) and/or by paralleling many components and reducing the on-state voltage. This may require a layout which is not optimized for switching, containing a large number of arrays and long leads. The merging of these two modules leads to very efficient switching.

Another benefit of the SCONS topology is that lower voltage components such as MOSFETs can be used for conduction, while higher voltage non-MOSFETs can be used for switching. This allows large arrays of MOSFETs or similar components to be put in parallel, driven at a reasonable speed while high voltage and higher power switches take the turn-on and turn-off switching loads.

There are many instances where it may not be necessary to use temperature enhancement for only one of the modules as embodied by the HYPER-CON or HYPER-SWITCH. A SCONS switch can be built at any temperature or combination of temperatures using the best parts and layouts available for those temperatures.

In summary, a first solid state module or group of series- and/or parallel-connected modules is placed in parallel with a second solid state module or group of series- and/or parallel-connected modules. One or both of these modules or groups of modules can be housed inside a cryogenic container (not shown) for cooling. This temperature inside this cryogenic container can be controlled via a flow of a liquid cryogen, such as liquid nitrogen, liquid helium, or any other cold liquid. It can also be controlled by one or more external refrigerators, or by a flow of one or more cold, gaseous refrigerants.

When only one of these modules or groups of modules is cooled, the other module or group of modules can be placed outside of the cryogenic container, and the parallel connection between the first and second modules or groups of modules can be achieved via electrical feed-throughs, that is, wires that pass through the walls of the cryogenic container. Both parallel branches need not be solid state construction although at least one branch should be to achieve the high benefits of this invention. One branch may even be of mechanical construction.

A control circuit is connected to the gates of both the first and the second module or group of modules to selectively place the modules in a conducting or non-conducting state. This control circuit may or may not be cooled, and therefore may or may not be housed inside the cryogenic container.

Superconducting wires, connectors, cables, thin films, etc., can and should be used wherever possible. For example, the parallel connections within the first and/or second module or group of modules can be made using superconducting thin films, provided either the first and/or second module or group of modules is cooled. Heat sinks (not shown) can be added to either the first or second module or group of modules, and wherever else they are necessary to absorb and distribute the heat loads generated in the modules.

What is claimed is:

1. A hybrid switch in a line, comprising:
   a first switching module for switching voltages and switching currents and for incurring substantially all switching losses during the turn on transition from a current off state of said hybrid switch to a current on state and during the turn off transition from said on state to off state of said hybrid switch; and
   a second switching module for conducting current between switching transitions and for incurring substantially all conduction losses,
   said first and second switching modules being connected electrically in parallel, and said switching modules being respectively controllable to be in one of an open non-conducting off state and a closed conducting state, at least one said switching module having solid state construction; and further comprising
   a control circuit for switching respectively said first module and said second module on and off, each module in a predetermined sequence and for predetermined intervals to reduce power losses in the conduction and switching operation of the hybrid switch.

2. A hybrid switch in a line, comprising:
   a first switching module for switching voltages and switching currents and for incurring substantially all switching losses during the turn on transition from a current off state of said hybrid switch to a current on state and during the turn off transition from said on state to off state of said hybrid switch; and a second switching module for conducting current between switching transitions and for incurring substantially all conduction losses, said first and second switching modules being connected electrically in parallel, and said switching modules being respectively controllable to be in one of an open non-conducting off state and a closed conducting state, at least one said switching module having solid state construction, at least one of said modules includes a MOSFET;

a control circuit for switching respectively said first module and said second module on and off, each module in a predetermined sequence and for predetermined intervals to reduce power losses in the conduction and switching operation of the hybrid switch.

3. The hybrid switch as in claim 1, wherein at least one of said first module and said second module is chosen from the group consisting of IGBTs, IGCTs, thyristors, and diodes.

4. The hybrid switch as in claim 1, wherein at least one of said first module and said second module is cryogenically cooled.

5. The hybrid switch as in claim 1, wherein said control circuit for switching said first module and said second module on and off is cryogenically cooled.

6. The hybrid switch as in claim 1, wherein at least two said second modules used for conducting currents are connected in parallel.

7. The hybrid switch as in claim 1, wherein at least two said first modules used for switching voltages and currents are connected in parallel.

8. The hybrid switch as in claim 1, wherein said control circuit activates the hybrid switch transition from said current off-state to said current on state by (a) turning said first module on while said second module is off, (b) turning said second module on to transfer current from said first module to said second module, (c) turning said first module off so that all current flows through said second module, thereby establishing the hybrid switch "current on state";

and wherein said control circuit in order to switch off said current through said second module, (d) turns on said first module transferring current from said second module to said first module, (e) turns said second module to said off state so as to divert said current to said first module, and then (f) turns said first module to its off state.

9. The hybrid switch as in claim 2, wherein at least one of said first module and said second module is cryogenically cooled.

10. The hybrid switch as in claim 2, wherein said control circuit activates the hybrid switch transition from said current off-state to said current on state by (a) turning said first module on while said second module is off, (b) turning said second module on to transfer current from said first module to said second module, (c) turning said first module off so that all current flows through said second module, thereby establishing the hybrid switch "current on state";

and wherein said control circuit in order to switch off said current through said second module, (d) turns on said first module transferring current from said second module to said first module, (e) turns said second module to said off state so as to divert said current to said first module, and then (f) turns said first module to its off state.

11. The hybrid switch as in claim 10, wherein at least said second module is cryogenically cooled to reduce conduction losses.

12. The hybrid switch as in claim 4, further comprising a refrigeration unit cryogenically cooling said at least one module.

13. The hybrid switch as in claim 9, further comprising a refrigeration unit cryogenically cooling said at least one module.

14. The hybrid switch as in claim 12, wherein at least said second module is cryogenically cooled to reduce conduction losses.

15. The hybrid switch as in claim 10, wherein at least said first module is cryogenically cooled to reduce switching time.

16. The hybrid switch as in claim 12, wherein at least said first module is cryogenically cooled to reduce switching time.

17. The hybrid switch as in claim 6, wherein at least another two said second modules used for conducting currents are connected in series.

18. A hybrid switch in a line, comprising:
a first switching module for switching voltages and switching currents and for incurring substantially all switching losses during the turn on transition from a current off state of said hybrid switch to a current on state and during the turn off transition from said on state to off state of said hybrid switch; and at least two second switching modules in series for conducting current between switching transitions and for incurring substantially all conduction losses, said first switching module and said in-series second switching modules being connected electrically in parallel, and said switching modules being respectively controllable to be in one of an open non-conducting off state and a closed conducting state, at least one said switching module having solid state construction, and further comprising a control circuit for switching respectively said first module and said in series second modules on and off, each module in a predetermined sequence and for predetermined intervals to reduce power losses in the conduction and switching operation of the hybrid switch.

19. A hybrid switch in a line, comprising:
at least two first switching modules in series for switching voltages and switching currents and for incurring substantially all switching losses during the turn on transition from a current off state of said hybrid switch to a current on state and during the turn off transition from said on state to off state of said hybrid switch; and a second switching module for conducting current between switching transitions and for incurring substantially all conduction losses, said in-series first switching modules and said second switching module being connected electrically in parallel, and said switching modules being respectively controllable to be in one of an open non-conducting off state and a closed conducting state, at least one said switching module having solid state construction, and further comprising a control circuit for switching respectively said in series first modules and said second module on and off, each module in a predetermined sequence and for predetermined intervals to reduce power losses in the conduction and switching operation of the hybrid switch.

* * * * *